United States Patent [19]
Kinsman et al.

[11] Patent Number: 5,173,451
[45] Date of Patent: Dec. 22, 1992

[54] SOFT BOND FOR SEMICONDUCTOR DIES

[75] Inventors: Larry D. Kinsman; Derek J. Gochnour, both of Boise, Id.

[73] Assignee: Micron Technology, Inc., Boise, Id.

[21] Appl. No.: 889,008

[22] Filed: May 26, 1992

Related U.S. Application Data

[63] Continuation-in-part of Ser. No. 788,165, Nov. 5, 1991, which is a continuation-in-part of Ser. No. 709,858, Jun. 4, 1991.

[51] Int. Cl.$^5$ .............................................. H01L 21/60
[52] U.S. Cl. ..................................... 437/209; 437/8; 437/217; 437/220
[58] Field of Search ............... 437/209, 212, 217, 220, 437/8, 207

[56] References Cited

U.S. PATENT DOCUMENTS

| | | | |
|---|---|---|---|
| 4,801,561 | 1/1989 | Sankhagowit | 437/207 |
| 4,842,662 | 6/1989 | Jacobi | 437/209 |
| 4,859,614 | 8/1989 | Sugahara et al. | 437/8 |
| 5,002,895 | 3/1991 | LeParquier et al. | 437/8 |
| 5,008,614 | 4/1991 | Shreeve et al. | 437/8 |
| 5,008,617 | 4/1991 | Czubatyj et al. | 437/8 |
| 5,023,189 | 6/1991 | Bartlow | 437/209 |

FOREIGN PATENT DOCUMENTS

| | | | |
|---|---|---|---|
| 41775 | 3/1980 | Japan | 437/8 |
| 128840 | 10/1980 | Japan | 437/8 |
| 164376 | 12/1980 | Japan | 437/8 |

*Primary Examiner*—Brian E. Hearn
*Assistant Examiner*—Kevin M. Picardat
*Attorney, Agent, or Firm*—Stanley N. Protigal

[57] ABSTRACT

On a semiconductor integrated circuit die, a semipermanent electrical connection is effected by the use of wirebond techniques, in which the parameters of the wirebond are controlled, so that less bonding force retains the leadwires to the bondpads than the attachment strength of the bondpads to the die. The wirebond techniques include attaching leadwires to bondpads on the die, using ultrasonic wedge bonding. The strength of the bond between the leadwires is significantly less than the attachment strength of the bondpads, preferably by a ratio which ensures that the bondpads are not lifted from the die when the leadwires are removed by breaking the bond between the leadwires and the bondpads. Subsequent to testing and burnin, the bond between the leadwires and the bondpads is severed. The die are then removed from the die cavity plate and the bondpads may then be attached by conventional means. The technique is useful in providing known good die.

26 Claims, 5 Drawing Sheets

SOFT BOND FOR SEMICONDUCTOR DIES

CROSS-REFERENCE TO RELATED APPLICATION

This is a continuation-in-part application to U.S. Patent application 788,165, filed Nov. 5, 1991, which is a continuation-in-part to U.S. Patent application No. 7/709,858, filed Jun. 4, 1991.

FIELD OF THE INVENTION

This invention relates to the establishment of connections for testing of the response of digital electronic devices in order t properly determine the functionality of integrated circuits. More particularly, it relates to electrical connections of semiconductor integrated circuit dies to leadframes and the like on a temporary basis in order to perform testing and burnin of the integrated circuit dies.

BACKGROUND OF THE INVENTION

Integrated circuit memory devices, such as dynamic random access memories (DRAMs) and static random access memories (SRAMs) undergo testing by the manufacturer during production and often by the end user, for example, in a memory test conducted during computer initialization. As densities of the memory device increase, so that individual IC's are capable of storing sixteen or more megabits of information, the time necessary for testing the IC's increases as well.

In addition, there is an increased interest in providing parts which are fully characterized prior to packaging. This is desired not only because of the cost of the package, but also because there is demand for multi-chip modules (MCMs), in which multiple parts in die form are tested and assembled into a single unit. While there are various techniques purposed for testing, burning in and characterizing a singulated die, it would be advantageous to be able to "wafer map" the die prior to assembly with as many performance characteristics as possible. Ideally, one would want to be able to map the wafer with full device characterization.

MCMs create a particular need for testing prior to assembly, as contrasted to the economics of testing parts which are discretely packaged as singulated parts. For discretely packaged parts, if the product yield of good parts from preliminary testing to final shipment (probe-to-ship) is, for example, 95%, one would not be particularly concerned with packaging costs for the failed parts, if packaging costs are 10% of the product manufacturing costs. Even where packaging costs are considerably higher, as in ceramic encapsulated parts, testing unpackaged die is economical for discretely packaged parts when the added costs approximates that of cost of packaging divided by yield:

$$C_{DIE} \times \frac{C_{PACKAGE}}{Yield} = C_{DIE} \times C_{ADDL.\ KGD}$$

where
C=cost
$C_{DIE}$=manufacturing cost of functional die
$C_{ADDL.KGD}$=additional cost of testing unpackaged die in order to produce known good die (KGD)

Note that in the case of discretely packaged parts, the cost of the die ($C_{DIE}$) is essentially not a factor. This changes in the case of MCMs:

$$(C_{DIE}) \times \frac{(number\ of\ die)}{Yield} \times C_{PACKAGE} = C_{DIE} \times C_{ADDL.\ KGD}$$

Note that again $C_{DIE}$ is not a factor in modules having identical part types; however, the equation must be modified to account for varied costs and yields of die in modules with mixed part types.

With MCMs, the cost of packaging a failed part is proportional to the number of die in the module. In the case of a x16 memory array module, where probe-to-ship yield of the die is 95%, the costs are:

$$\frac{16}{0.95} \times C_{PACKAGE} = C_{ADDL.\ KGD}$$

so the additional costs of testing for known good die (KGD) may be 16 times the cost of testing after assembly of an unrepairable module in order to be economical. This, of course, is modified by the ability to repair some failed modules.

One of the test procedures which is used to determine the viability of semiconductor integrated circuits is burnin. In the burnin procedure, the parts are exercised for a period of time with different temperature cycles, including at elevated temperatures. This procedure provides an indication of the operation of the device at the different operating temperatures, and also results in a determination of early part failures. During the burnin process, such early failures, known as "infant mortality," is predicted to occur within a particular amount of time. Therefore, if it can be determined that almost all such failures occur within the first 48 hours of burnin testing, then the burnin test can be completed within that time period. Such factors as temperature, process and device type influence when failures stop happening, so the specific burnin time period will vary with part type and other factors. In the case of testing of packaged discrete devices, each device is able to be separately monitored by external test equipment, so that the external test equipment can be used to provide an indication of the time of failure of that particular part.

In testing die prior to encapsulation, temporary electrical connection must be effected between the die and a fixture. This is accomplished in the bond region, either at the bondpads or closely adjacent the bondpad. In the case of wirebond die, the bondpads is often produced at a level which is not raised above the top surface of the die and may be recessed below the top surface.

One process which causes the top of the bondpads to be recessed is one in which the bondpads are formed, but not formed with raised topography, followed by the formation of a passivation layer. The bondpads are left exposed through the passivation layer, but are recessed below the top of the passivation layer. During wirebonding, the recessed position of the bondpads is inconsequential, but this can create a problem with other attachment techniques. If the die are to be tested prior to encapsulation, the die must be compatible with both the test attachment and the later permanent attachment, and the test attachment must not damage the die in such a way as to inhibit permanent attachment.

In a prior art technique, raised conductive portions of conductive layers could be formed by photoplating. The raised portion is a bump which is used as an electrical contact so that, when a plate is brought into contact with a semiconductor die, the bump engages a bondpad on the die. This contact of the bump with the bondpad on the die presents two problems; dimensional accuracy and distortion.

The raised portions engage diebond pads on the die and the raised portion is compressed against the diebond pads. Subsequent to the raised portion being used, it may be desired to separate the conductive layer, and thereby disconnect the connector from the diebond pads on the die. At this point, the raised portions have been compressed and are unsuitable for reuse without being reformed.

When the bump is used as an electrical contact to engage a bondpad on a semiconductor die, dimensional accuracy is a requisite. Bondpads on semiconductors are made small (approximately 100μ) in order to conserve useful surface area, known as "real estate," on the die. In the case of wirebonded die, the size of the bondpad is usually selected to be sufficient to permit a wirebonder to reliably establish wirebond connections to the die. Other connection techniques, such as TAB, have their own requirements, but the bondpads are similarly restricted in size.

The bondpads used in wirebonded die are usually recessed below a passivation layer. The passivation layer is a film of insulator, such as BPSG, and can form a barrier to effective contact of the bump with the bondpad if the bump is too large or is out of alignment.

Other techniques include ball bonding, in which wirebonding techniques are used to deposit a small amount of material on a conductive portion. Rather than permitting a wire to remain attached to the bondsite, sufficient energy is applied to the wirebonder to cause the wire to break from the bondsite, thereby leaving an attached portion of the wire, known as a ball bond. The material for this process must of course be selected in order to permit the process to be properly implemented.

In a prior art technique, raised conductive portions of conductive layers could be formed by a process known as doinking. In doinking, a raised portion of conductive material is formed from material by bringing a probe in close proximity to the material and applying energy to the material. In the preferred embodiment, the probe has a center opening and the applied energy is a combination of thermal energy and ultrasonic mechanical vibration of the probe. The process, known as doinking, uses ultrasonic forging and results in a doink, which consists of a raised portion of the material, surrounded by a crater.

SUMMARY OF THE INVENTION

According to the invention, a semipermanent electrical connection is effected by the use of wirebond techniques, in which the parameters of the wirebond are controlled sufficiently to permit the semipermanent connection to be removed without significantly damaging the die.

This is accomplished by first preparing a semiconductor integrated circuit die, including bondpads such as wirebond pads or bondpads for TAB (tape automated bonding) electrical connections.

A precured RTV silicone strip, commonly known as "gel pack," is used for temporarily securing the die in place within a die cavity plate. The backing strip exhibits a static charge sufficient and coefficient of friction sufficient to hold the die in place without adhesive.

Leadwires are attached to the bondpads, preferably by the use of ultrasonic wedge bonding, with less bonding force retaining the leadwires to the bondpads than the attachment strength of the bondpads to the die. Subsequent to testing and burnin, the bond between the leadwires and the bondpads is severed. The strength of the bond between the leadwires is significantly less than the attachment strength of the bondpads, preferably by a ratio which ensures that the bondpads are not lifted from the die when the leadwires are removed by breaking the bond between the leadwires and the bondpads. The die are then removed from the die cavity plate and the bondpads may then be attached by conventional means, such as wirebonding, TAB or flip chip bonding.

DETAILED DESCRIPTION OF THE PREFERRED EMBODIMENTS

Figure 1:
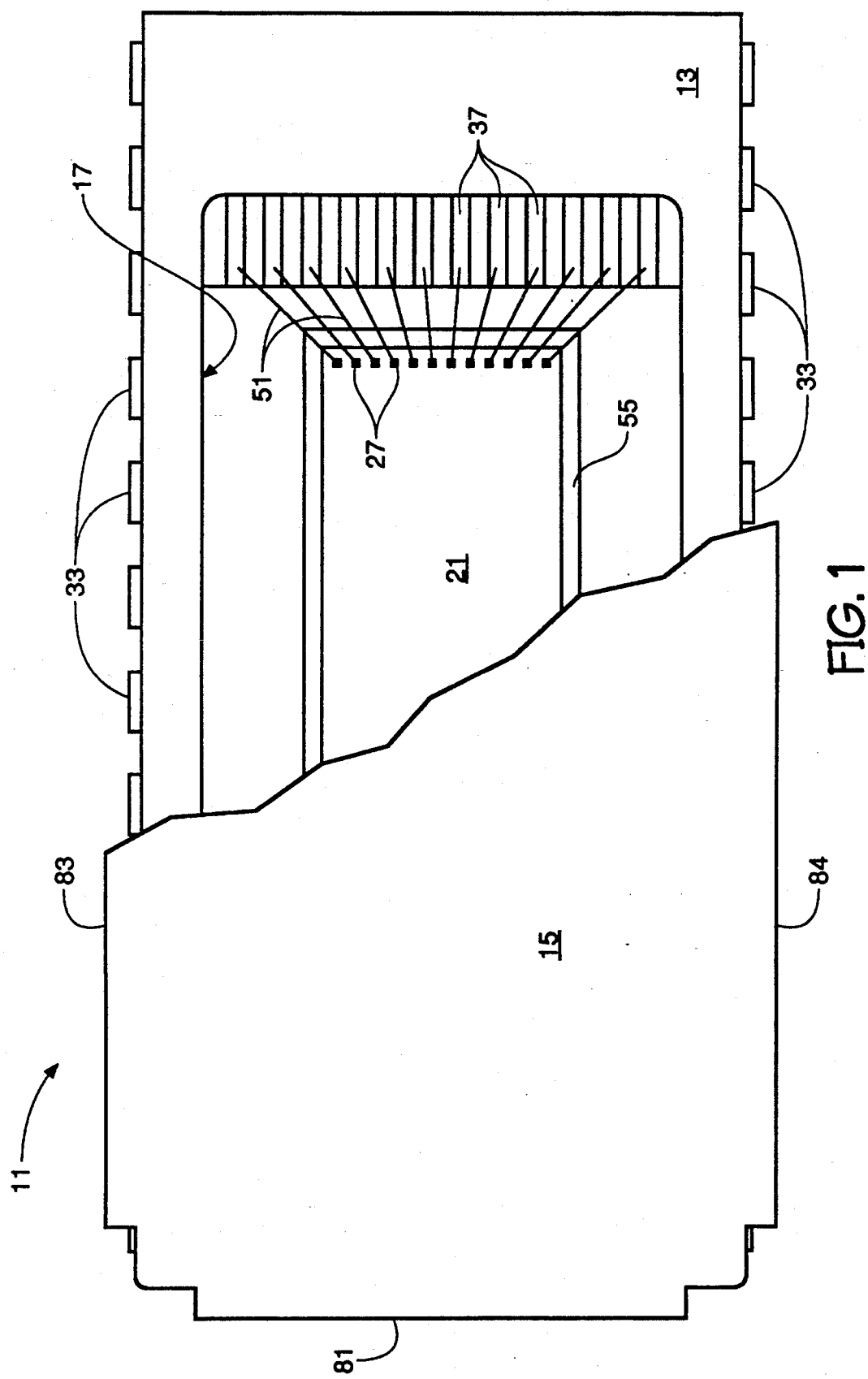
FIG. 1 shows a top view of substrate on which a softbond wirebond connection has been established by the inventive techniques.
Figure 2:
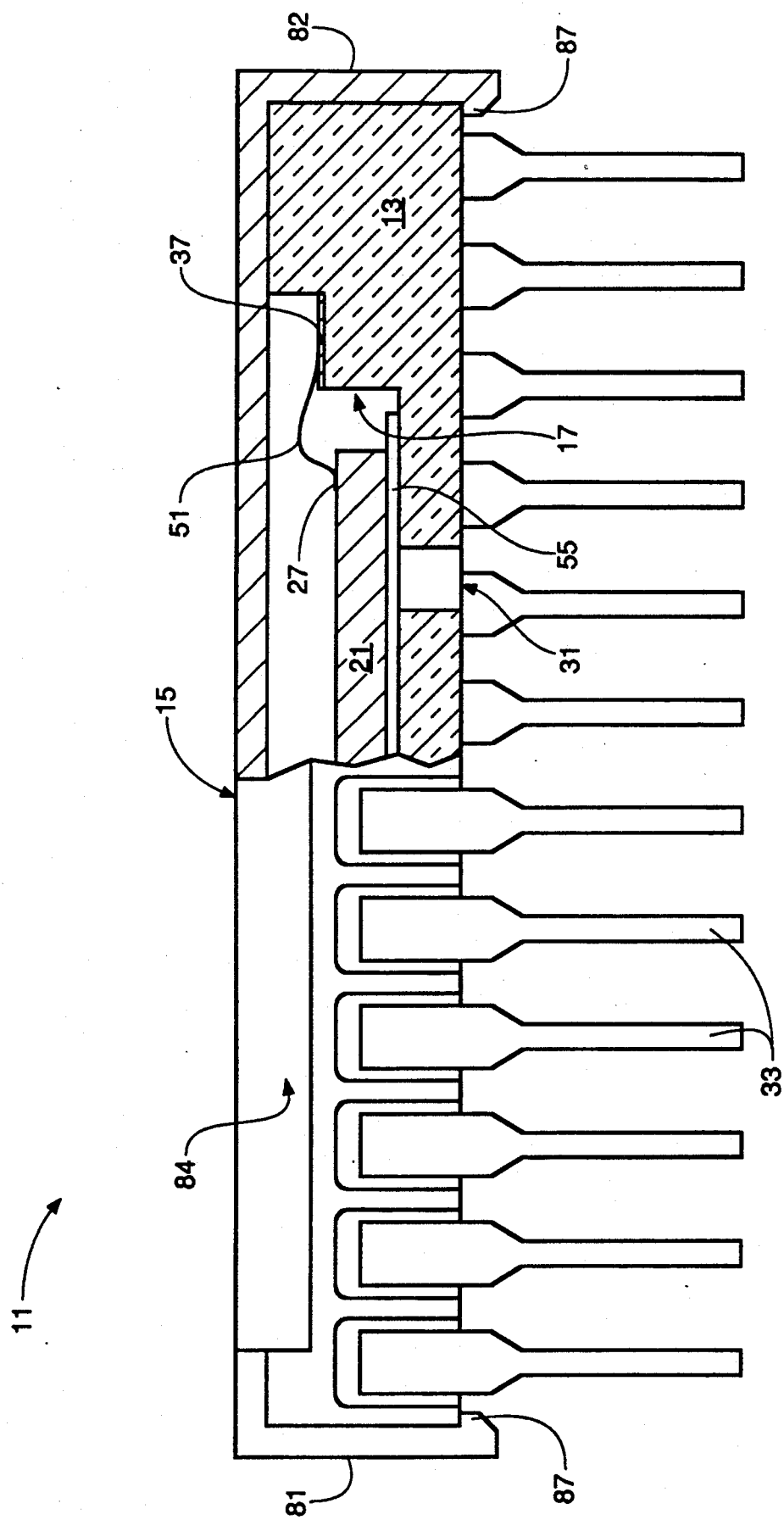
FIG. 2 shows a cross-section of the substrate of FIG. 1.

Referring to FIGS. 1 and 2, the inventive burn-in fixture 11 includes a die cavity plate, 13 and a cover plate 15. The die cavity plate 13 includes a die receiving cavity 17.

The die receiving cavity 17 has dimensions which are at least sufficient to accommodate a die 21. The die 21 is to be connected at bondpads 27, which are typically 0.1 mm wide. The die cavity plate 13 therefore functions as a die carrier for the purpose of such things as burnin and testing of the die 21.

The die cavity plate 13 may be provided with a slot 31 which permits convenient access to the bottom of the die 21 in order that the die 21 may be lifted out of the die receiving cavity 17. At present, the slot 31 is not provided, and removal of the die 21 from the die receiving cavity 17 is accomplished by using tweezers to lift the die 21 from the die cavity plate 13. If adhesive is used to secure the die 21 in the die receiving cavity 17, then heat may be applied to the die cavity plate 13 to facilitate removal of the die 21.

A plurality of external connector leads 33 extend from the burn in fixture 11. These external leads 33 are used to connect the die 21 to external test and burnin circuitry, in the manner of the leads of an integrated circuit part.

As can be seen in FIG. 2, in the preferred embodiment, the external connector leads 33 are attached to the die cavity plate 13, and extend therefrom. The external connector leads 33 are shown as connector pins, which preferably are in a DIP (dual inline package) or QFP (quad flat pack) configuration.

The external connector leads 33 are secured by the die cavity plate 13 and terminate on the die cavity plate 13 with contact pads 37. The contact pads 37 are in approximate planar alignment with the bondpads 27. The bondpads 27 are typically recessed below a top surface level 43, established by a BPSG passivation layer 45.

Referring to FIGS. 1 and 2, connections between the contact pads 37 on the die cavity plate 13 and the bondpads 27 are effected by leadwires 51. The leadwires 51 therefore are able to conduct signals between the bondpads 27 and the contact pads 37, so that an electrical connection is established between the bondpads 27 and contact pads 37.

It is believed that an optimum technique for temporarily securing the die 21 in place in the die cavity plate 13 is the use of a precured RTV silicone strip, commonly known as "gel pack," as a backing strip 55. The backing strip 55 exhibits a static charge sufficient and coefficient of friction sufficient to hold the die 21 in place without adhesive, and also is elastomeric. In other words, the silicone holds the silicon in place.

An alternative technique, which has been tested in prototype test procedures using this invention, utilizes a tape type die attach adhesive, sold by E.I. duPont de Nemours of Wilmington, Delaware, under the trademark Kapton QL Die Attach Adhesive. The QL adhesive is heated, but for a shorter time period than for permanently packaged die. This allows a standard process setup to be used for temporary die attach, while permitting the adhesive attachment of the die to be readily be overcome subsequent to testing and burnin.

Significantly, the leadwires 51 are not permanently bonded to the bondpads 27. Ohmic contact is established, but the bond is effected so that the bonding force is less than that which would lift the bondpads 27 from the die 21 when the wirebonds 51 are removed. This also enables the leadwires 51 to be lifted from the die 21 without destroying the bondpads 27. The leadwires 51 therefore are able to conduct signals between the bondpads 27 and the contact pads 37.

Figure 3:
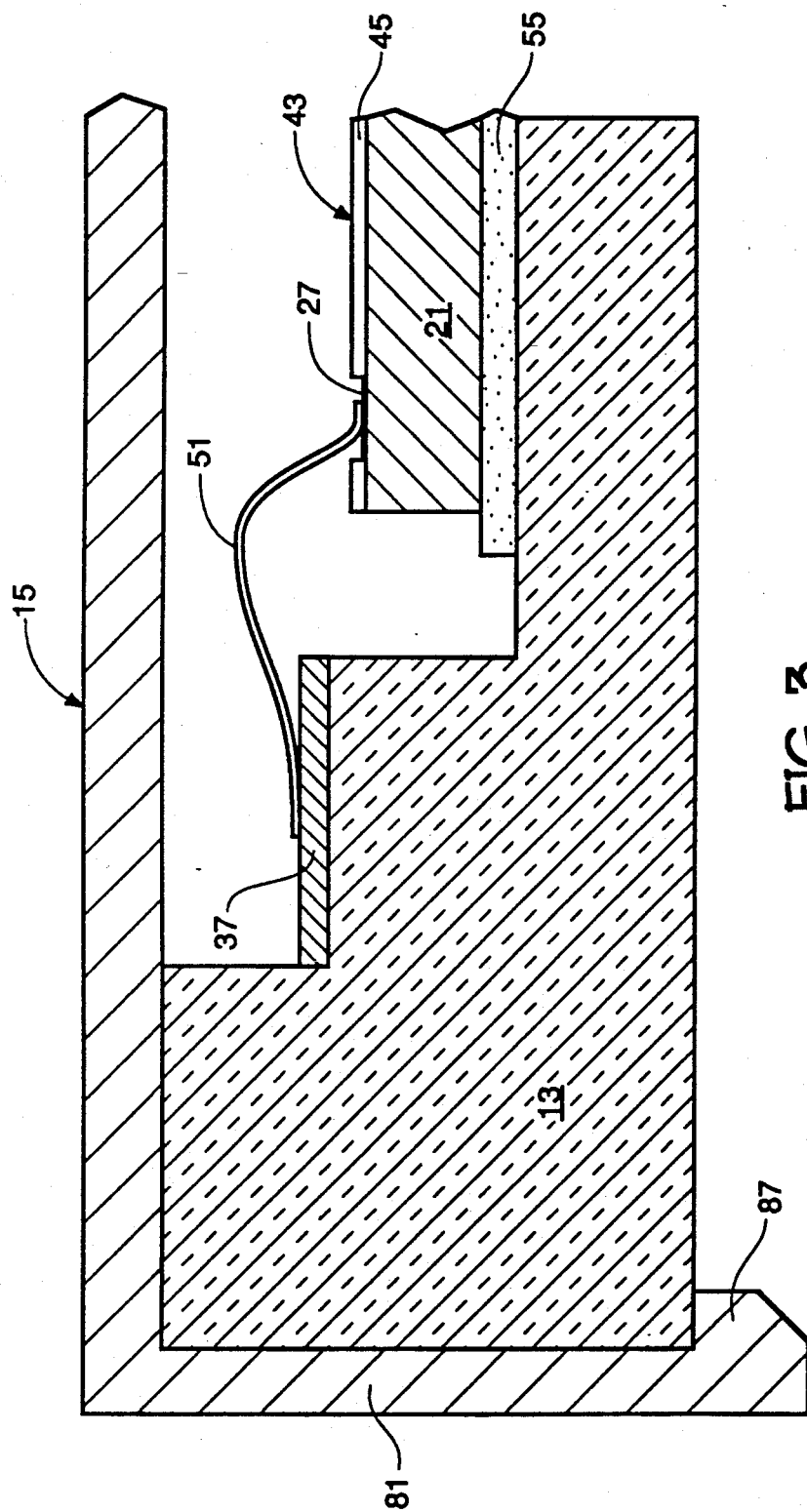
FIG. 3 shows the cross-section of FIG. 1 subsequent to removal of the wirebond connection.

Referring to FIG. 3, the bondpads 27 are a part of the die 21 and either the entire bondpad 27 or possibly a part of the bondpad 27 may be separated from the die 21 if sufficient force is applied to the bondpad 27. This phenomena is known as "lifting" and is considered undesirable, because it results in destroying the die. For this reason, the leadwires 51 are attached to the bondpads 27 with less bonding force retaining the leadwires to the bondpads 27 than the attachment strength of the bondpads 27 to the die. In order to provide a margin for variation in the fabricated bondpads 27, the strength of the bond between the leadwires 51 is significantly less than the attachment strength of the bondpads 27. This is preferably a ratio which ensures that the bondpads 27 are not lifted from the die 21 when the leadwires 21 are removed by breaking the bond between the leadwires 51 and the bondpads 27.

Figure 4:
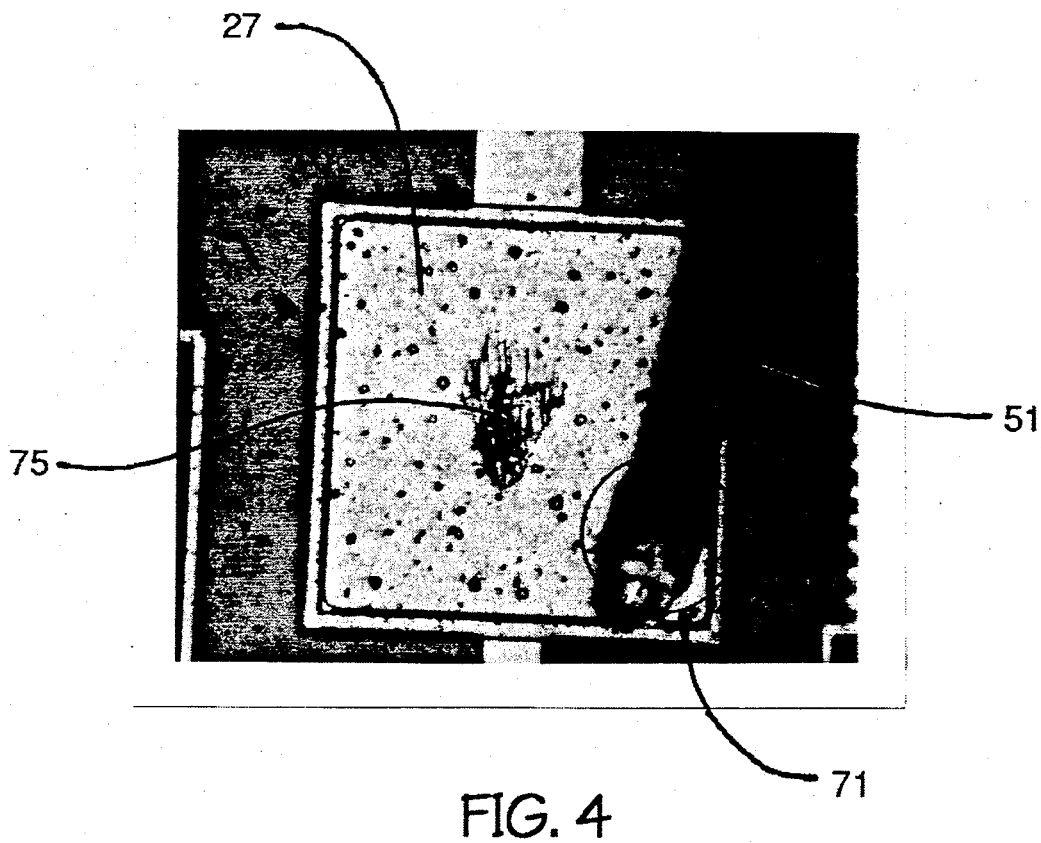
FIG. 4 is a low resolution scanned photomicrograph, showing a wirebond connection formed in accordance with the preferred embodiment.

The relative wirebond : bondpad attachment strength should favor the bondpad even in cases where the wirebond is effected close to the edge of the bondpad 27, as shown in FIG. 4. This should be 1:4 wirebond : bondpad attachment strength, but lesser ratios, such as 1:2, 1:1.5 or 1:1.3 would be effective.

In order to provide the reduced bonding force, a reduced size wirebond is used. This is particularly adaptable to the use of aluminum wirebond, in which ultrasonic vibration and pressure is used to attach the aluminum to the contact pads 37. The leadwire connection effected in this manner is weakest at the location of attachment.

The wirebonder is a Kulicke & Soffa KS Model 1471 wirebonder, with which aluminum wire is wedge bonded at ambient temperature. In conventional wirebonding, a bond foot having a length of 2.5 mils is used with 1.25 mil diameter aluminum wire. In the preferred embodiment, a wedge having a bond foot of 0.5 mil in diameter was used. The wire size is 0.7 mil. This generates the following results:

TABLE 1

|  | CONVENTIONAL WEDGE BONDING | INVENTIVE TECHNIQUE |
| --- | --- | --- |
| MATERIALS: | | |
| wedge | KS 60ABT-2025 | KS 30ABT-1505 |
| bond foot (length) | 2.5 mils | 0.5 mil |
| wire diameter (1% SI/AL) | 1.25 mils | 0.7 mil |
| wire tensile | 19-21 grams | 13-15 grams |
| wire elongation | 1-4% | 0.5-2.0% |
| CHARACTERISTICS: | | |
| actual bond size (width × length) | 2.25 × 3.0 mils | 0.75 × 0.5 mils |
| MACHINE SETUP: | | |
| wirefeed angle | 60 | 30 |
| bond type | forward | reverse |
| tearing motion | tear | clamp |
| motor speed | 90% | 40% |
| init. bond force | 32-38 grams | 9-14 grams |
| MACHINE PARAMETERS: | | |
| tip offset (mils) | 10 | 15 |
| velocity (mils/msec) | 15 | 5 |
| time (msec) | 15-25 | 20-40 |
| power (units) | 90-105 | 18-28 |
| force (grams) | 5-8 | 2-8 |
| loop height (mils) | 12-18 | 6-9 |
| clamp close | tear | bond |
| tail feed length | 45-60 | 12-17 |
| tail tear length | 20-25 | 30-40 |

Figure 5:
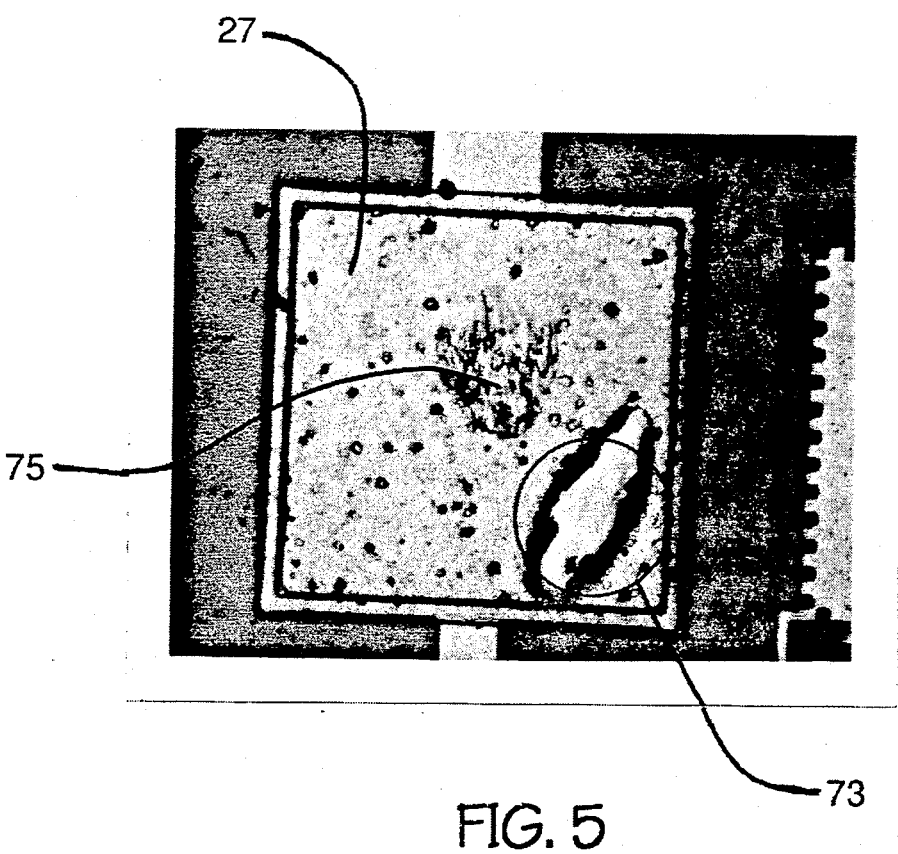
FIG. 5 is a low resolution scanned photomicrograph, showing a bondpad subsequent to severing the wirebond connection of FIG. 4.

The result is a wirebond 71, shown in the photomicrograph of FIG. 4. The wirebond, while being conductively effective, is easily removed from the die 21 at completion of testing and burnin. The bond has similar bond properties to conventional wirebonding on an intermolecular level, but, as a result of its smaller footprint, is easily removed. The removed wirebond, as shown in FIG. 5, leaves a damaged area 73 on the bondpad 27. This is acceptable, and does not significantly deteriorate the bondpad 27 for later permanent wirebonding or other connection process. The larger scar 75 is a probe tip mark, resulting from probe pre-testing of the die 21 while still in wafer form.

As shown in FIGS. 4 and 5, the temporary wirebond 71 may be near the edge of the bondpad 27. The ratio of the strength of the bond between the leadwires 51 to bondpad 27 to the attachment strength of the bondpads 27 must be sufficiently low to ensure that, even if the wirebond 71 is toward the edge of its bondpad 27, that bondpad 27 would not be lifted from the die 21 when the leadwires 21 are removed.

As shown in FIGS. 1 and 2, the cover plate 15 is then placed on the die cavity plate 13. The cover plate 15 is preferably formed of thermoplastic of thermosetting plastic, and is flanged (flanges 81-84). A pair of inwardly facing projections 87 extend from at least two of the flanges 81,82. The flanges 81-84 further serve to retard the introduction of particles into the die cavity plate 13 during burnin and test operations.

In the preferred embodiment, the wirebonder is used to remove the leadwires. The wirebonder is easily controlled to sweep across the wirebonds, and in the event that one of the wirebonders becomes inaccurate for its intended purpose, it is still likely to be usable to sweep wires which are attached by the inventive techniques. It is also possible to use a probe or tweezers to sweep the wires.

The connection is thereby removed without significantly damaging the die. The die 21 itself is then removed, preferably with a tweezer-like instrument. If QL adhesive is used, thermal application is used in order to facilitate removal of the die 21 from the die cavity plate 13.

Figure 6:
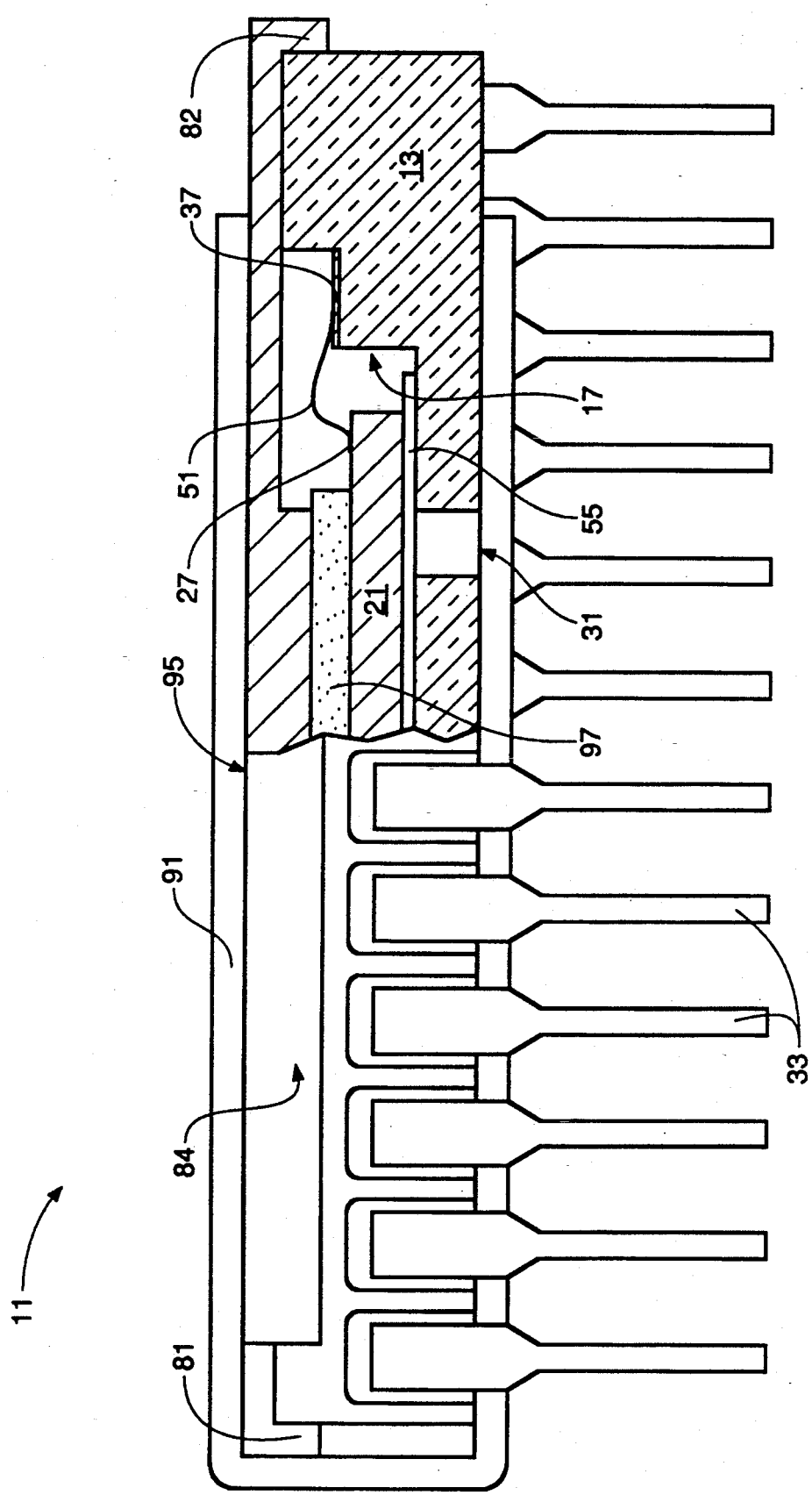
FIG. 6 shows a modification of the invention, in which support for the die is provided by the test housing.

In lieu of the inwardly facing projections 87, a clamp 91 may be used to secure a cover plate 95 in place over the die cavity plate 13, as shown in FIG. 6. The clamp 91 may consist of a wire clasp which may either be latched into place against itself, as shown, or is fitted into parallel horizontal locations in the die cavity plate 13 and the cover plate 95.

Also, as shown in FIG. 6, an optional top elastomeric strip 97 may be used to further secure the die 21 in position in the housing 13. The top elastomeric strip 97 is placed over a portion of the die 21 separate from the leadwires 51. The combination of the elastomeric strip 97 and the "gel pak" backing strip 55 secure the die 21 from movement when the housing 13 is handled.

While specific locations for bondpads had not been specified, it is possible to test a variety of configurations, including the conventional arrangement of bondpads at the ends of the die 21. While a DIP package is shown and described, it is possible to use surface mount and edge mount packages, such as quad flat packs (QFPs). The invention may also be used for testing die configured for LOC (leads over chip), as well as other designs. It is also possible to configure the die cavity plate 13 to include test circuitry in order to facilitate burnin or testing of the die 21. In each of the above examples, the assembled fixture is adapted into conventional test equipment, such as a burn-in oven. What has been described is a very specific configuration of a test fixture. Clearly, modification to the existing apparatus can be made within the scope of the invention. Accordingly, the invention should be read only as limited by the claims.

We claim:

1. Method for connecting a semiconductor circuit die external equipment for testing purposes and testing the die, whereby the die may be subsequently disconnected, characterized by:
    a) placing the die in a die carrier having a die receiving portion thereon, said die carrier having a plurality of connectors thereon for connection to test circuitry, and said die carrier having a plurality of bondpads in close proximity of the die receiving portion;
    b) attaching leadwires to the die at bondpads on the die and attaching the leadwires to the bondpads on the die carrier, said attachment of leadwires to the bondpads on the die being with sufficient bonding force to provide an electrical connection and to retain the leadwires on the bondpads on the die during a test sequence, and said bonding force being less than an attachment force of the bondpads on the die to the die and less than the tensile strength of the leadwires separate from the bondpads;
    c) providing signals to at least one of the bondpads on the die carrier in response to signals to at least one of the connectors, and providing signals to at least one of the connectors in response to signals at least one of the bondpads;
    d) removing the leadwires from the bondpads on the die by mechanically applying force to the wires, the force applied to the wires resulting in the attachment of the leadwires to the bondpads on the die, wherein, for a given force applied to the leadwires, the bond attachment of the leadwires to the bondpads on the die is removed while the leadwires may remain unsevered and the bondpads remain intact; and
    e) removing the die from the die carrier.

2. Method as described in claim 1, further comprising:
the step of placing the die in a die carrier including securing the die in the die carrier with a thermoplastic adhesive.

3. Method as described in claim 2, further comprising:
the step of removing the die from the die carrier including application of thermal energy to the adhesive, thereby loosening the die from the adhesive.

4. Method as described in claim 1, further comprising:
the step of placing the die in a die carrier including securing the die in the die carrier with a material having a property of exhibiting a static charge sufficient and coefficient of friction sufficient to hold the die in place without adhesive.

5. Method as described in claim 1, further comprising:
the step of placing the die in a die carrier including securing the die in the die carrier with a silicon strip which exhibits a static charge sufficient to hold the die in place.

6. Method as described in claim 1, further comprising:
the step of placing the die in a die carrier including securing the die in the die carrier with a silicon strip which exhibits a static charge sufficient to hold the die in place within the die carrier during the attachment of the leadwires to the bondpads on the die.

7. Method as described in claim 6, further comprising:
placing a lid over the die carrier after the die has been placed in the die carrier, the lid securing the die from movement.

8. Method as described in claim 1, further comprising:
said attachment of the leadwires to the die being accomplished by applying ultrasonic energy applied through an ultrasonic wirebonder.

9. Method as described in claim 8, further comprising:
said attachment of the leadwires to the die being effected with a bond strength which is less than one fourth the attachment strength of the bondpads to the die.

10. Method as described in claim 8, further comprising:
said attachment of the leadwires to the die being effected with a bond strength which is less than half the attachment strength of the bondpads to the die.

11. Method as described in claim 8, further comprising:
said attachment of the leadwires to the die being effected with a bond strength which is less than two thirds the attachment strength of the bondpads to the die.

12. Method as described in claim 1, further comprising:
said attachment of the leadwires to the die being accomplished by applying ultrasonic energy applied through an ultrasonic wirebonder to aluminum leadwire, whereby, the wirebonder is selected to provide a bond size which is less than 0.25 ×the bond size which is appropriate for a permanent wirebond for the die.

13. Method as described in claim 1, further comprising:
said attachment of the leadwires to the die being accomplished by applying ultrasonic energy applied through an ultrasonic wirebonder, whereby, the wirebonder is selected to provide a bond size which is less than 0.1 ×the bond size which is appropriate for a permanent wirebond for the die.

14. Method for temporarily connecting a semiconductor circuit die to external equipment for testing purposes in order to generate reliability and test data concerning the die, characterized by:
a) placing the die in a die carrier having a die receiving portion thereon, said die carrier having a plurality of connectors thereon for connection to test circuitry, and said die carrier having a plurality of bondpads in close proximity of the die receiving portion, the bondpads communicating with the connectors;
b) attaching leadwires to the die at bondpads on the die and attaching the leadwires to the bondpads o the die carrier by applying ultrasonic energy applied through an ultrasonic wirebonder, said attachment of leadwires to the bondpads on the die being with sufficient bonding force to provide a electrical connection and to retain the leadwires on the bondpads on the die during a test sequence, and said bonding force being less than an attachment force of the bondpads on the die to the die and less than the tensile strength of the leadwires separate from the bondpads
c) removing the leadwires from the bondpads on the die by mechanically applying force to the wires, the force applied to the wires resulting in the attachment of the leadwires to the bondpads on the die, wherein, for a given force applied to the leadwires, the bond attachment of the leadwires to the bondpads on the die is removed while the leadwires may remain unsevered and the bondpads remain intact; and
d) removing the die from the die carrier.

15. Method as described in claim 14, further comprising:
the step of placing the die in a die carrier including securing the die in the die carrier with a thermoplastic adhesive.

16. Method as described in claim 15, further comprising:
the step of removing the die from the die carrier including application of thermal energy to the adhesive, thereby loosening the die from the adhesive.

17. Method as described in claim 14, further comprising:
the step of placing the die in a die carrier including securing the die in the die carrier with a material having a property of exhibiting a static charge sufficient and coefficient of friction sufficient to hold the die in place without adhesive.

18. Method as described in claim 14, further comprising:
the step of placing the die in a die carrier including securing the die in the die carrier with a silicon strip which exhibits a static charge sufficient to hold the die in place.

19. Method as described in claim 14, further comprising:
the step of placing the die in a die carrier including securing the die in the die carrier with a silicon strip which exhibits a static charge sufficient to hold the die in place within the die carrier during the attachment of the leadwires to the bondpads on the die.

20. Method as described in claim 19, further comprising:
placing a lid over the die carrier after the die has been placed in the die carrier, the lid securing the die from movement.

21. Method as described in claim 14, further comprising:
said attachment o the leadwires to the die being accomplished by applying ultrasonic energy applied through an ultrasonic wirebonder.

22. Method as described in claim 21, further comprising:
said attachment of the leadwires to the die being effected with a bond strength which is less than one fourth the attachment strength of the bondpads to the die.

23. Method as described in claim 21, further comprising:
said attachment of the leadwires to the die being effected with a bond strength which is less than half the attachment strength of the bondpads to the die.

24. Method as described in claim 21, further comprising:
said attachment of the leadwires to the die being effected with a bond strength which is less than two thirds the attachment strength of the bondpads to the die.

25. Method as described in claim 14, further comprising:
said attachment of the leadwires to the die being accomplished by applying ultrasonic energy applied through an ultrasonic wirebonder to aluminum leadwire, whereby, the wirebonder is selected to provide a bond size which is less than 0.25×the bond size which is appropriate for a permanent wirebond for the die.

26. Method as described in claim 14, further comprising:
said attachment of the leadwires to the die being accomplished by applying ultrasonic energy applied through an ultrasonic wirebonder, whereby, the wirebonder is selected to provide a bond size which is less than 0.1×the bond size which is appropriate for a permanent wirebond for the die.

* * * * *

UNITED STATES PATENT AND TRADEMARK OFFICE
CERTIFICATE OF CORRECTION

PATENT NO. : 5,173,451
DATED : December 22, 1992
INVENTOR(S) : Kinsman et al

It is certified that error appears in the above-indentified patent and that said Letters Patent is hereby corrected as shown below:

Column 1, line 5, kindly delete "788,165" and insert --788,065--.

Signed and Sealed this

Twenty-sixth Day of April, 1994

Attest:

BRUCE LEHMAN

*Attesting Officer*    *Commissioner of Patents and Trademarks*